(12) United States Patent
Bae et al.

(10) Patent No.: US 7,542,372 B2
(45) Date of Patent: Jun. 2, 2009

(54) CIRCUIT AND METHODS FOR ELIMINATING SKEW BETWEEN SIGNALS IN SEMICONDUCTOR INTEGRATED CIRCUIT

(75) Inventors: Seung-Jun Bae, Seo-gu (KR); Kwang-Il Park, Yongin-si (KR); Seong-Jin Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 28 days.

(21) Appl. No.: 11/770,766

(22) Filed: Jun. 29, 2007

(65) Prior Publication Data

US 2008/0123454 A1    May 29, 2008

(30) Foreign Application Priority Data

Jun. 30, 2006    (KR)    ........... 10-2006-0060285

(51) Int. Cl.
*G11C 8/00* (2006.01)
(52) U.S. Cl. .................. 365/233.1; 365/233.11; 365/222; 365/194
(58) Field of Classification Search ............. 365/233.1, 365/233.11, 222, 194
See application file for complete search history.

(56) References Cited

U.S. PATENT DOCUMENTS

| | | | |
|---|---|---|---|
| 4,630,098 A * | 12/1986 | Fling | ............ 348/449 |
| 4,680,632 A * | 7/1987 | Willis et al. | ............ 348/537 |
| 5,917,760 A | 6/1999 | Millar | |
| 6,075,832 A | 6/2000 | Geannopoulos et al. | |
| 6,121,815 A | 9/2000 | Terada et al. | |
| 6,810,486 B2 | 10/2004 | Fayneh et al. | |
| 2005/0138277 A1* | 6/2005 | Koo | ............ 711/105 |

FOREIGN PATENT DOCUMENTS

| KR | 2000-0056166 | 9/2000 |
|---|---|---|
| KR | 2003-0045264 | 6/2003 |

* cited by examiner

*Primary Examiner*—Thong Q Le
(74) *Attorney, Agent, or Firm*—Volentine & Whitt, PLLC

(57) ABSTRACT

A circuit for eliminating a skew between data and a clock signal in an interface between a semiconductor memory device and a memory controller includes an edge information storage unit which stores edge information output from the semiconductor memory device, a pseudo data pattern generating unit which outputs pseudo data including a pattern similar to actually transmitted data, a phase detecting unit which receives the edge information from the edge information storage unit and the pseudo data from the pseudo data pattern generating unit to detect a phase difference between the data and the clock signal and generate a corresponding detection result, and a phase control unit which controls a phase of the clock signal according to the corresponding detection result from the phase detecting unit, so as to eliminate a per-data input/output pin skew in a data write and read operation of the semiconductor memory device.

9 Claims, 12 Drawing Sheets

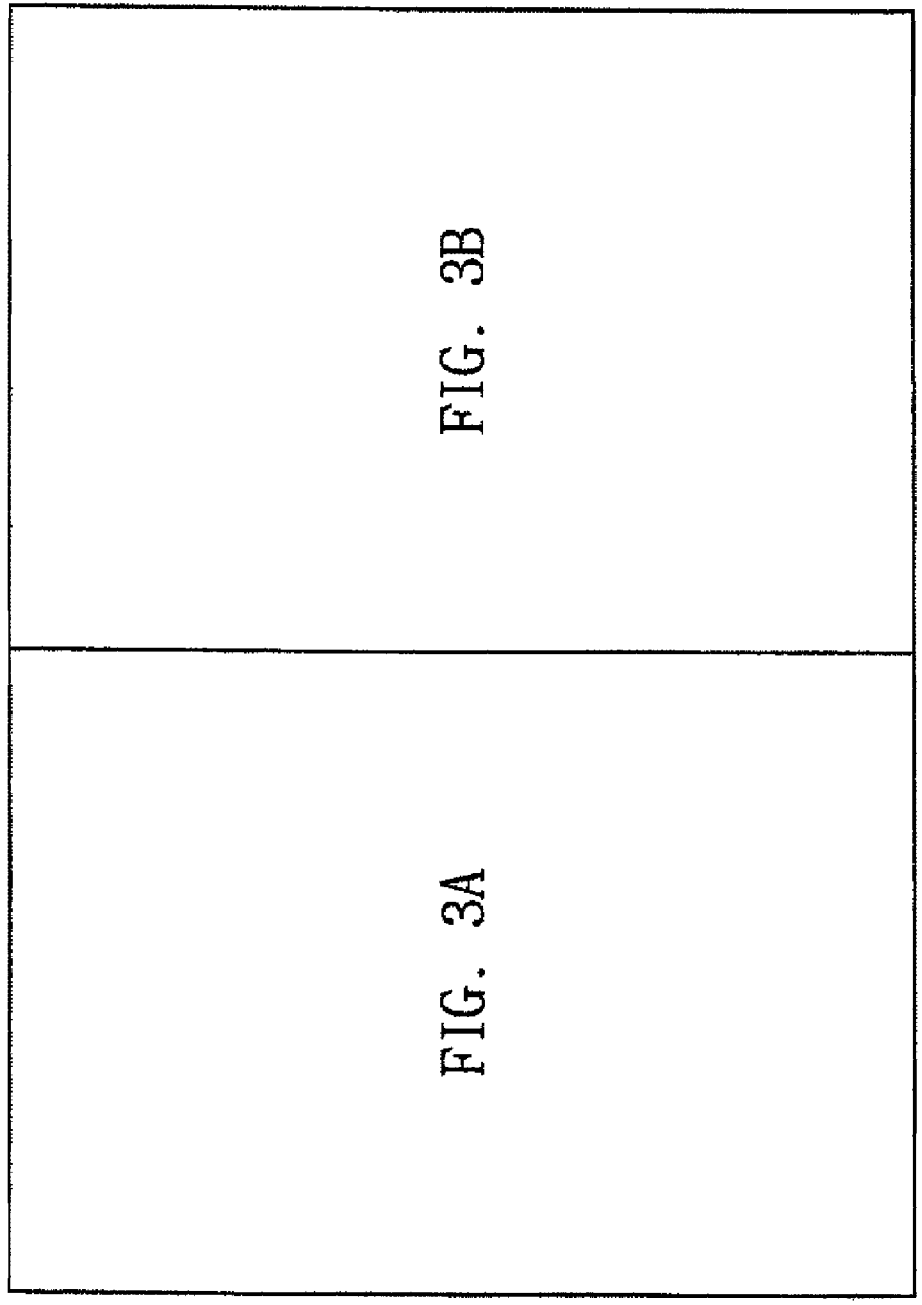

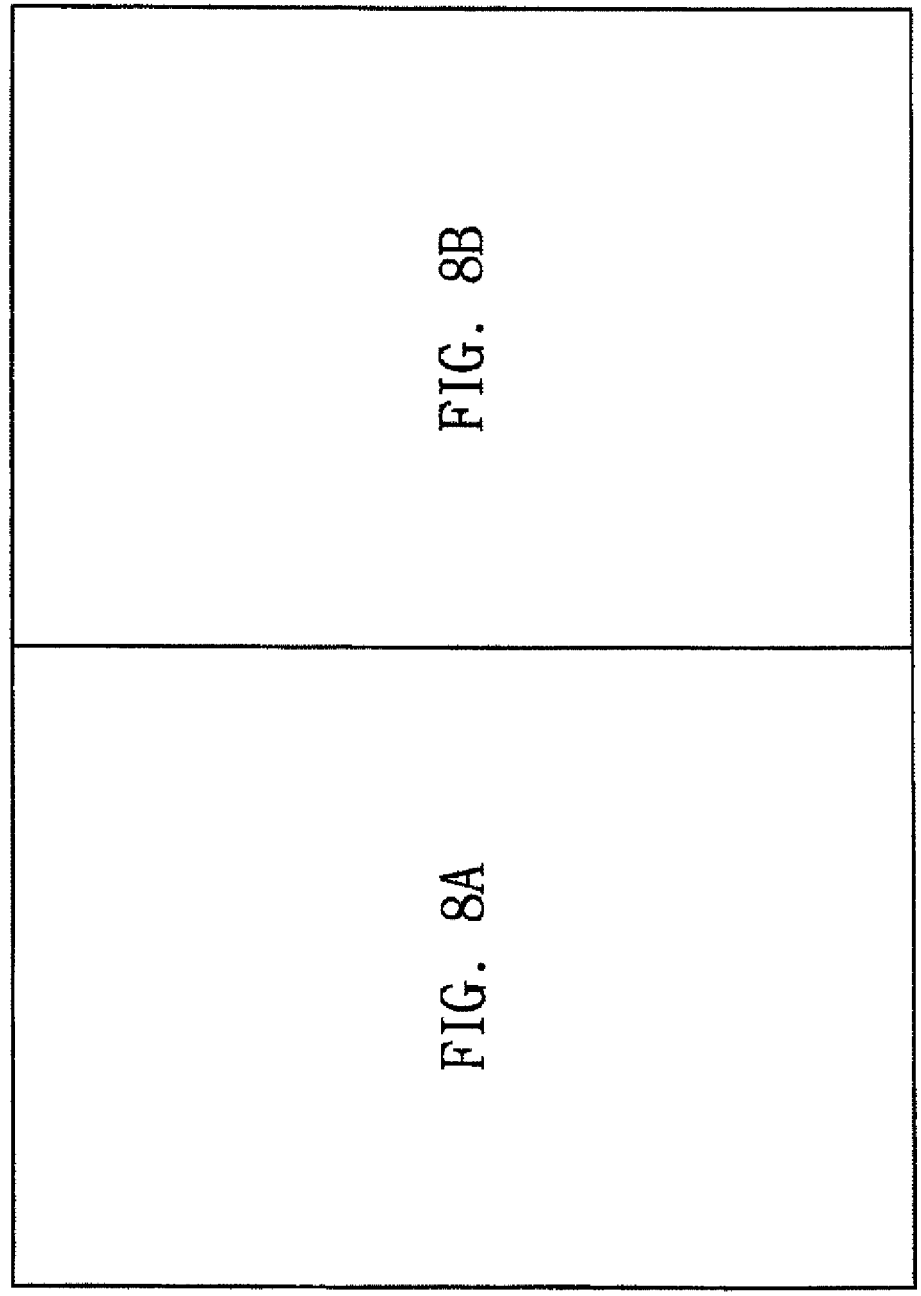

CIRCUIT AND METHODS FOR ELIMINATING SKEW BETWEEN SIGNALS IN SEMICONDUCTOR INTEGRATED CIRCUIT

CROSS-REFERENCE TO RELATED APPLICATION

A claim of priority is made to Korean Patent Application No. 10-2006-0060285, filed Jun. 30, 2006, the disclosure of which is hereby incorporated herein by reference in its entirety.

BACKGROUND OF THE INVENTION

1. Technical Field

The present disclosure relates to a semiconductor integrated circuit, and, more particularly, to a semiconductor integrated circuit which reduces a skew between data and a clock signal, and a method for eliminating a skew by using the same.

2. Discussion of Related Art

In serial communication schemes, communication circuits transmit the clock signal together with the data signals. On the other hand, in parallel communication schemes, communication circuits transmit the clock signal separately from the data.

Because the serial communication schemes transmit the clock signal along with the data, a serial interface on the receiving end uses a clock data recovery scheme ("CDR") to extract the clock signal from the received data. In addition, the CDR scheme also eliminates any skew between the clock signal and the received data. To this end, in the CDR scheme, a clock signal tracks any variation occurring in the data during data transmission so as to help maintain a suitable sampling position. Furthermore, the CDR scheme also ensures that the data transmission and reception operation is not affected by any variation in temperature or voltage. In addition, in a CDR scheme, a clock signal to be used for sampling ("sampling clock") is extracted from data.

While the above-mentioned features of a CDR scheme make it an attractive choice in the field of serial communications, the CDR scheme suffers from several limitations such as, for example, an increased circuit area.

FIG. 1 is a schematic waveform diagram illustrating a basic principle of a conventional CDR scheme. Referring to FIG. 1, clock data (Clk_data) and a clock edge (Clk_edge) are spaced at a half period. In particular, the clock data (Clk_data) is part of a clock signal for identifying data, and the clock edge (Clk_edge) is another part of the clock signal for extracting data edge information.

For example, when the data is changed from logic 0 to logic 1 and from logic 1 to logic 0, a phase relationship between the data and the clock signal can be obtained using the clock edge (Clk_edge). Furthermore, the above-described CDR scheme is called an x2 oversampling scheme because data is obtained twice in one period.

In the CDR scheme, the clock signal tracks data variation even during data transmission so that a suitable sampling position is maintained. Accordingly, temperature variation or voltage variation does not affect data transmission.

However, the CDR scheme requires a separate receiving circuit for identifying a clock edge (Clk_edge), data, and a sampling clock and detecting an edge of the data, and a separate phase control circuit for changing the phase of the clock. This requirement of two separate circuits in a CDR scheme leads to an increased area requirement for a CDR scheme. Accordingly, the CDR scheme is difficult to use in a parallel communication scheme that is used in, for example, a DRAM.

Instead, in parallel communication schemes, per-pin skew calibration may be used to eliminate the skew between a received clock signal and received data. In particular, there exists a training-based per-pin skew calibration scheme that exhibits substantially the same skew eliminating effect as the CDR scheme, but requires a smaller area. That is, unlike the CDR scheme, the training-based per-pin skew calibration scheme does not require a separate data edge detection circuit in a receiving circuit. This per-pin skew calibration scheme which is used mainly in a semiconductor memory device such as a DRAM will now be described with reference to FIG. 2.

FIG. 2 is a schematic waveform diagram illustrating a conventional per-pin skew calibration scheme. Generally, in the per-pin skew calibration scheme, phase shift is performed by a memory controller, and not by a semiconductor memory device.

First, data is stored at a low frequency in the semiconductor memory device. Then, in a data read operation, the data is read with a per-pin clock phase of the controller shifted by one step for per-pin skew calibration. The phase step shift is for periodically determining whether the read data has an error. In this case, by detecting a phase in which an error (i.e., fail (F)) is generated, it is possible to determine a phase in which the error is least likely to be generated (i.e., pass (P) is most likely to occur). The same method is used during a data write operation to adjust the data phase of each pin.

While the per-pin skew calibration scheme uses less area than a CDR scheme, the per-pin skew calibration scheme consumes more time than the CDR scheme to perform one operation. Accordingly, frequent operation of the system may degrade system performance. Furthermore, periodic calibration is required because the operation speed decreases in actual chip operation and a skew varies with temperature or voltage variation.

There is therefore a need for skew elimination circuits and methods that use less area and also have higher operating speeds without the need for frequent calibration. The present disclosure is directed towards such skew elimination circuits and methods.

SUMMARY

An aspect of the present disclosure includes a circuit for eliminating a skew between data and a clock signal in an interface between a semiconductor memory device and a memory controller. The circuit includes an edge information storage unit which stores edge information output from the semiconductor memory device, a pseudo data pattern generating unit which outputs pseudo data including a pattern similar to actually transmitted data, a phase detecting unit which receives the edge information from the edge information storage unit and the pseudo data from the pseudo data pattern generating unit to detect a phase difference between the data and the clock signal and generate a corresponding detection result, and a phase control unit which controls a phase of the clock signal according to the corresponding detection result from the phase detecting unit, so as to eliminate a per-data input/output pin skew in a data write and read operation of the semiconductor memory device.

Another aspect of the present disclosure includes a method for eliminating a skew between data and a clock signal in an interface between a semiconductor memory device and a memory controller. The method comprises reading data edge information from the semiconductor memory device, detecting a phase difference between the data and the clock signal using the read data edge information and preset data information, and adjusting a phase of the clock signal according to the detected phase difference, wherein clock data recovery operation is performed in each data period to eliminate a per-data input/output pin skew in a data write and read operation of the semiconductor memory device.

Yet another aspect of the present disclosure includes a circuit for eliminating a skew between data and a clock signal in an interface between a semiconductor memory device and a memory controller. The circuit comprises a receiving unit which receives data and performs data oversampling, a phase information calculating unit which performs a corresponding calculation based on the data oversampling performed by the receiving unit, and a phase control unit which adjusts a phase of the data according to the corresponding calculation performed by the phase information calculation unit so as to eliminate a per-data input/output pin skew in a data write and read operation of the semiconductor memory device.

BRIEF DESCRIPTION OF THE DRAWINGS

The above and other features of the present disclosure will become more apparent to those of ordinary skill in the art by describing in detail exemplary embodiments thereof with reference to the attached drawings in which.

DETAILED DESCRIPTION

The present disclosure will now be described more fully hereinafter with reference to the accompanying drawings, in which exemplary embodiments of the invention are shown. This disclosure may, however, be embodied in different forms and should not be construed as limited to the embodiments set forth herein. Rather, these embodiments are provided as teaching examples of the disclosure.

The present disclosure relates to a circuit for eliminating a skew between a clock signal and data and a method for eliminating the skew by using the same. More particularly, the present disclosure relates to a per-pin circuit for eliminating a skew and a method for eliminating a skew. Herein, the terms "eliminate", "eliminating", and variations thereof are intended to encompass both substantial reduction in skew and complete reduction in skew.

FIG. 3 is a block diagram illustrating a system including a skew eliminating circuit which eliminates a skew between data and a clock signal according to an exemplary disclosed embodiment. Referring to FIG. 3, the system comprises a semiconductor memory device 100 and a memory controller 120. In an exemplary embodiment, the semiconductor memory device 100 may be a dynamic random access memory (DRAM), and the memory controller 120 may be a control unit, such as a central processing unit (CPU) or a microprocessor unit (MCU).

Figure 1:
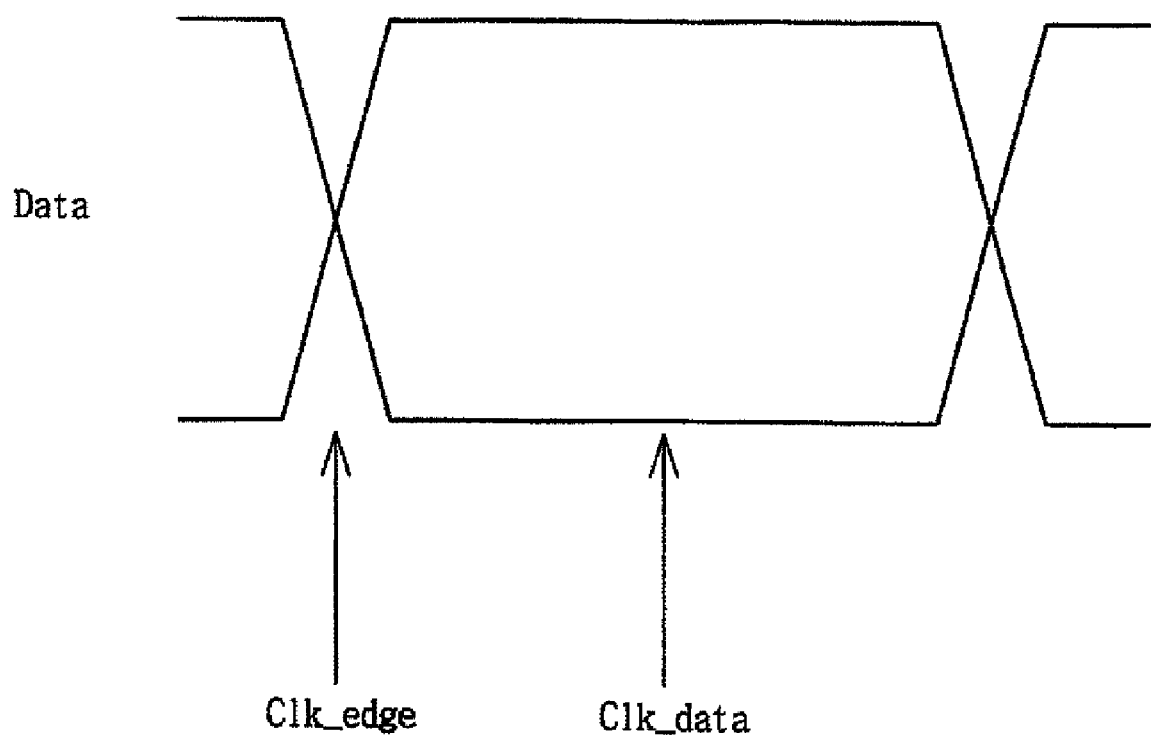
FIG. 1 is a schematic waveform diagram illustrating a basic principle of a conventional CDR scheme.
Figure 2:
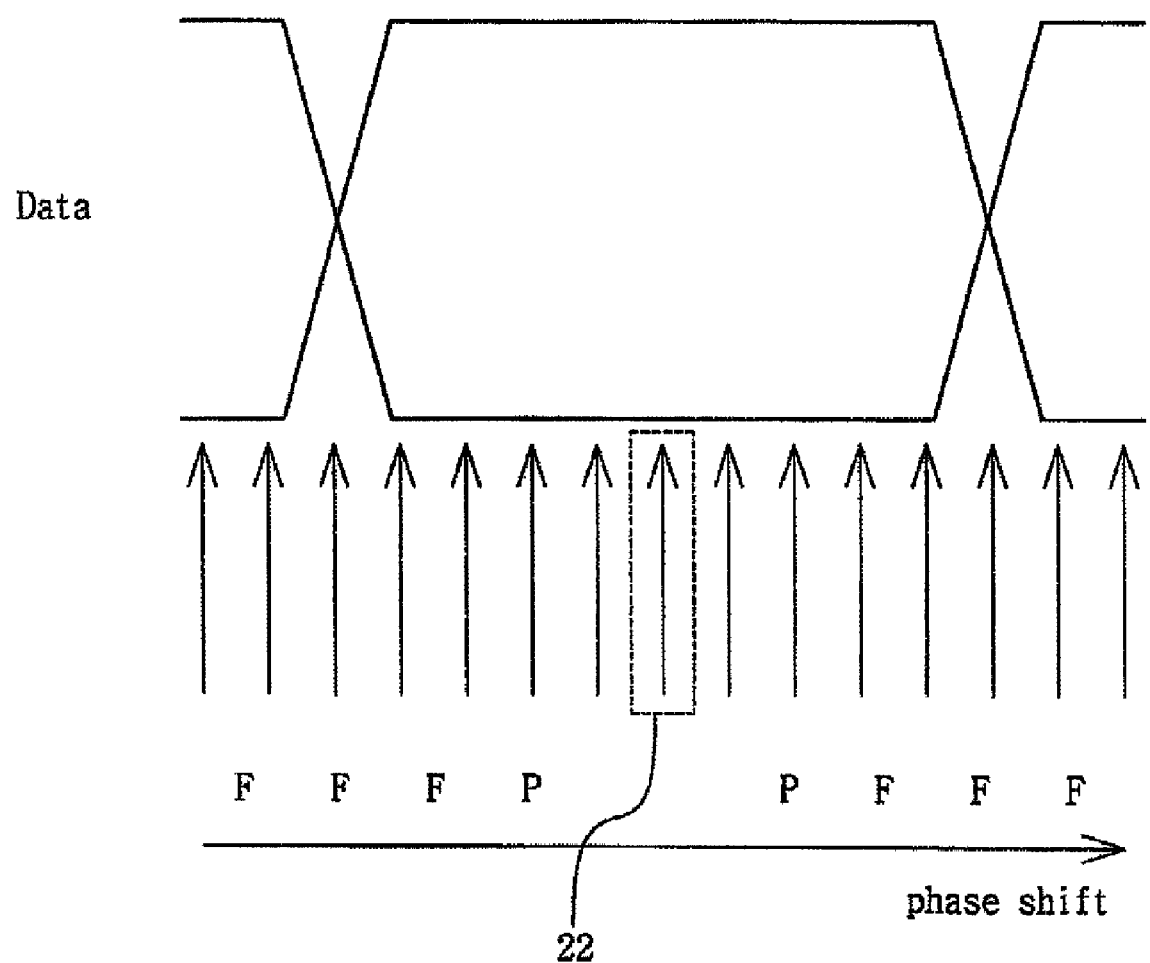
FIG. 2 is a schematic waveform diagram illustrating a conventional per-pin skew calibration scheme.
Figure 3A:
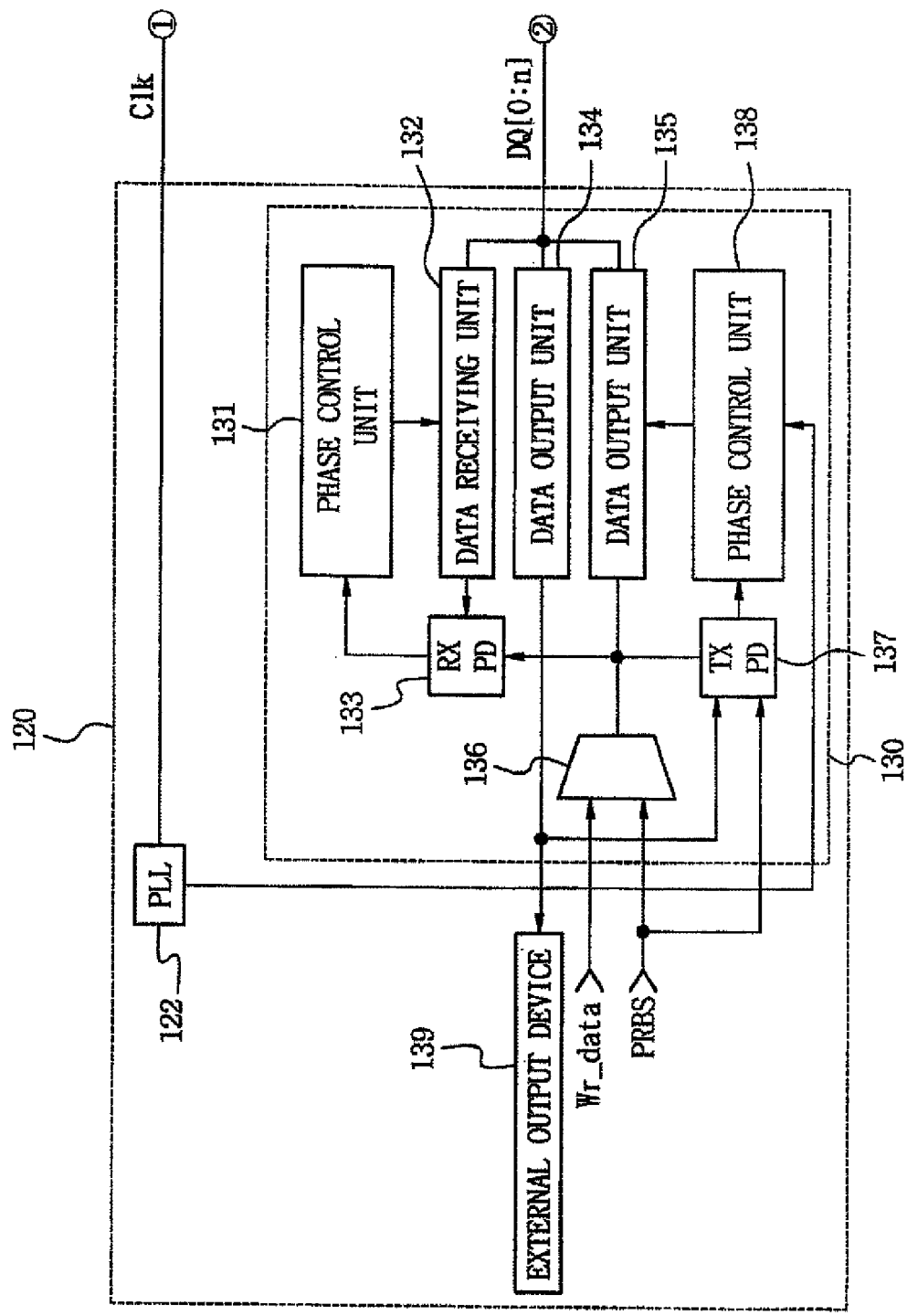
FIG. 3 is a block diagram illustrating a system including a skew eliminating circuit which eliminates a skew between data and a clock signal according to an exemplary disclosed embodiment.
Figure 3B:
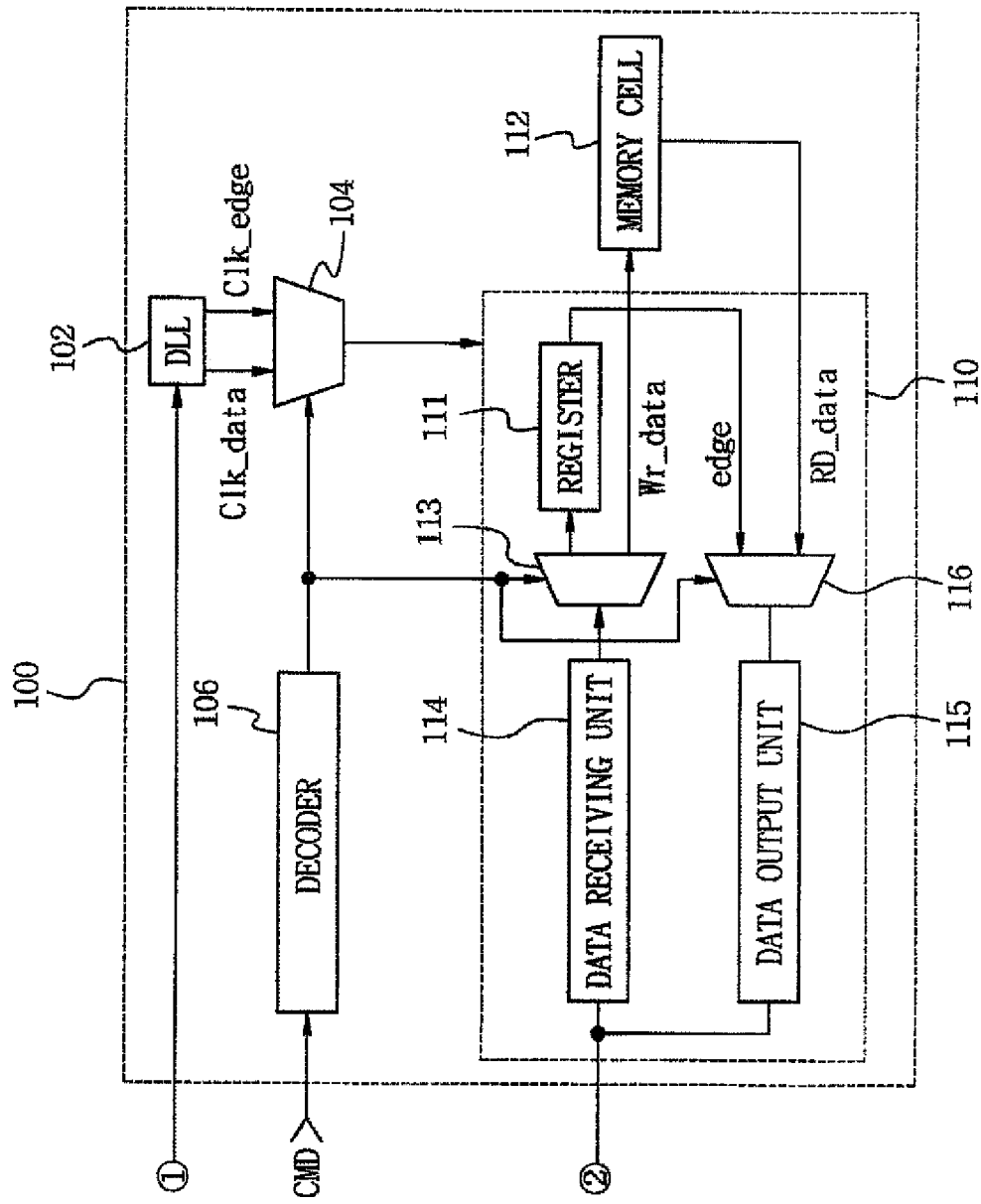

Referring to FIG. 3B, the semiconductor memory device 100 comprises a transceiver 110 which transmits and receives data via the memory controller 120, a decoder 106 which receives and decodes commands, and a delay lock loop (DLL) circuit 102 which generates a clock signal together with a PLL circuit 122 of the memory controller 120 and applies it to the transceiver 110.

In particular, the transceiver 110 includes a data receiving unit 114, a data output unit 115, multiplexers 113 and 116, and a register 111.

The data receiving unit 114 receives data from the memory controller 120 via data input/output pin DQ[0:n], and outputs it to the multiplexer 113. The multiplexer 113 receives the data signal from the data receiving unit 114 and a signal from the decoder 106, outputs data Wr_data to be written to the memory cell 112, and stores the edge information in the register 111.

The data output unit 115 receives data from the multiplexer 116 and outputs it to the data input/output pin DQ[0:n]. The multiplexer 116 receives and multiplexes the signal from the decoder 106, data Rd_data from the memory cell 112, and the edge information, and then outputs the resultant signal to the data output unit 115.

Referring to FIG. 3A, the memory controller 120 comprises the PLL circuit 122 which generates the clock signal Clk, and a transceiver 130.

The transceiver 130 includes a multiplexer 136, a data receiving unit 132, data output units 134 and 135, a transmitting phase detecting unit (TX PD) 137, a receiving phase detecting unit (RX PD) 133, and phase control units 131 and 138.

The data receiving unit 132 receives the data from the semiconductor memory device 100 via the data input/output pin DQ[0:n], and transmits it to the receiving phase detecting unit 133 under control of the phase control unit 131.

The data output unit 134 receives the data from the semiconductor memory device 100 via the data input/output pin DQ[0:n], and transmits it to an external output device 139 and transmitting phase detecting unit (TX PD) 137.

The multiplexer 136 receives data Wr_data to be written to the memory cell of the semiconductor memory device and pseudo data, i.e., pseudo random binary sequence (hereinafter, referred to as PRBS for convenience of illustration) having a pattern similar to the data Wr_data from a pseudo data pattern generating unit, and provides them to the data output unit 135.

The memory controller 120 includes a phase control unit 138 which eliminates a skew on the data input/output pin DQ[0:n] in write and read operation. Accordingly, in the read/write operation of the semiconductor memory device 100, clock phase adjustment is entirely performed by the memory controller.

In the read operation of the semiconductor memory device 100, the memory controller 120 may always eliminate the skew by performing CDR operation. In the write operation of the semiconductor memory device 100, a per-data input/output pin skew is first eliminated using a conventional skew eliminating scheme prior to initial system operation.

Furthermore, the elimination of a dynamic skew caused by temperature and voltage variation is performed in a refresh operation section of the semiconductor memory device to maximally prevent degradation of system performance. This will be described later. For example, the CDR operation is performed in a CAS before RAS (CBR) section within the refresh operation section because data transmission between the memory controller and the semiconductor memory device does not occur in the CBR section.

When a temperature or voltage changes beyond a predetermined amount in the system, the CDR operation is performed by a separate command. Specifically, in the CDR operation, the clock edge (Clk_edge) is used instead of the clock data (Clk_data), which is applied to the multiplexer 104 of the semiconductor memory device. The clock data (Clk_data) is a clock signal part located at a center of the data eye window, and the clock edge (Clk_edge) is a clock signal part located at an edge of the data eye window, as described earlier.

In the CDR operation, the receiving unit 114 can obtain the data edge information by using the clock edge (Clk_edge). Then, by sending the edge information to the memory controller 120, the CDR operation is performed.

Figure 4:
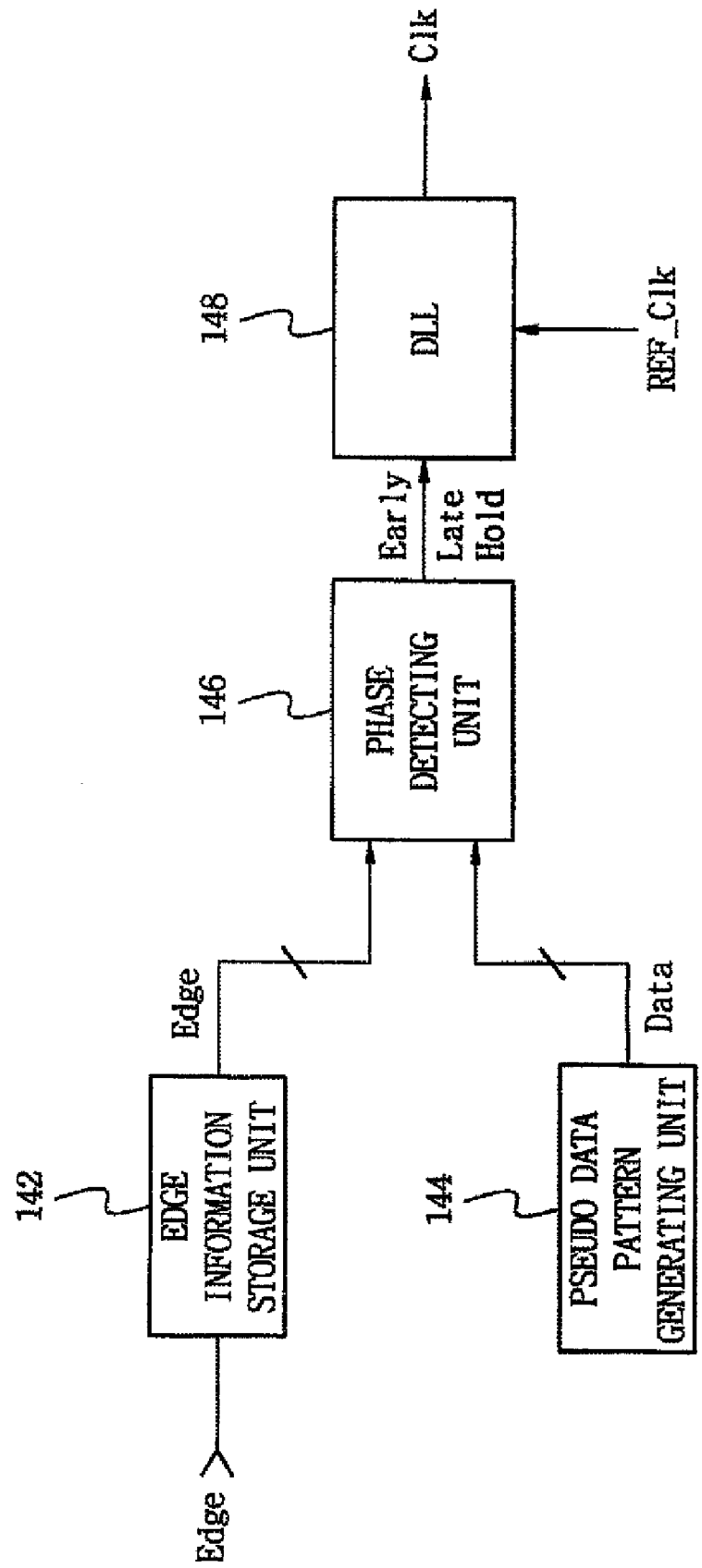
FIG. 4 is a block diagram illustrating a phase detecting unit and a phase control unit in a memory controller of FIG. 3 according to an exemplary disclosed embodiment.

FIG. 4 is a block diagram illustrating the transmitting phase detecting unit 137 and the phase control unit 138 in the memory controller of FIG. 3A.

Referring to FIGS. 3A, 3B, and 4, the skew eliminating circuit for eliminating a skew between data and a clock signal in an interface between the semiconductor memory device 100 and the memory controller 120 includes an edge information storage unit 142, a pseudo data pattern generating unit 144, a phase detecting unit 146, and a phase control unit (e.g., delay lock loop (DLL) circuit) 148.

The edge information storage unit 142 stores the edge information output from the semiconductor memory device 100 and outputs it to the phase detecting unit 146. The pseudo data pattern generating unit 144 generates pseudo data having a pattern similar to the actually transmitted data and outputs it to the phase detecting unit 146.

The phase detecting unit 146 receives the edge information from the edge information storage unit 142 and the pseudo data from the pseudo data pattern generating unit 144 and detects the phase difference between the data and the clock signal by using the edge information and the pseudo data.

The phase control unit (148) controls the phase of the clock signal according to the detection result from the phase detecting unit 146. That is, the phase control unit 148 compares the phase of the data clock with the phase of the data edge to perform early, hold, or late operation, in order to control the phase of the clock signal according to the detection result from the phase detecting unit 146. Thus, by using the phase detecting unit 146 and the phase control unit 148, a per-data input/output pin skew can be eliminated in the data write and read operation of the semiconductor memory device 100.

Referring to FIG. 4, in the CDR operation, the PRBS data predetermined by the pseudo data pattern generating unit 144 is used. Specifically, the PRBS data having a pattern similar to the actual data is transmitted to reduce jitter (i.e., a time base error), or noise.

Thus, the memory controller 120 reads the data edge information from the semiconductor memory device 100, stores it in the edge information storage unit 142, and uses the data edge information together with the PRBS data to determine whether the phase detecting unit 146 increases, decreases or holds the phase of the clock signal.

The phase detecting unit 146 is configured as in the above-described CDR and performs operation to reduce the jitter. The early, hold, and late information of the phase detecting unit 146 enables the phase control unit 148 to optimize the clock phase. Accordingly, this scheme can extract the phase information without performing oversampling in the semiconductor memory device 100, unlike the conventional scheme.

In this manner, in the data read operation of the semiconductor memory device 100, the skew eliminating circuit shown in FIGS. 3 and 4 performs the clock data recovery (CDR) operation for extracting the sampling clock from the data to eliminate the skew.

The disclosed skew eliminating circuit also performs per-data input/output pin skew elimination operation in the refresh section in which data transmission does not occur between the semiconductor memory device 100 and the memory controller 120, in order to eliminate the dynamic skew. The refresh section may be, for example, a CAS before RAS (CBR) section. Furthermore, the dynamic skew is caused by variations in operation temperature or voltage, as described previously.

Figure 5:
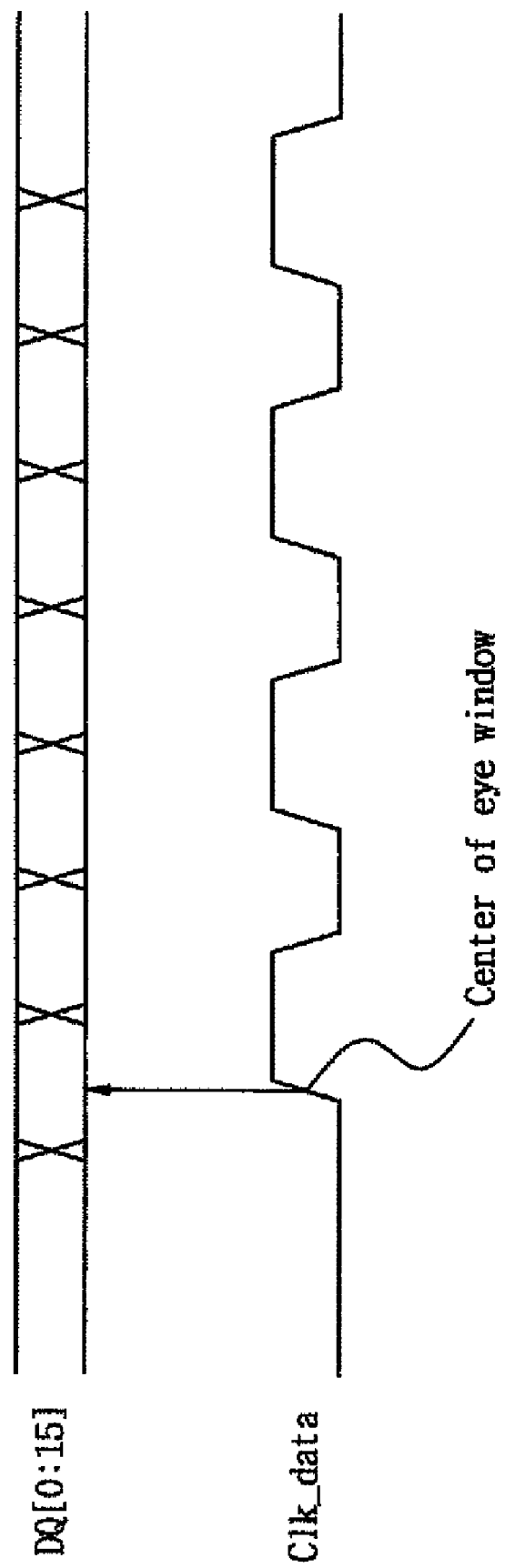
FIG. 5 is a timing diagram illustrating normal operation of the skew eliminating circuit of FIG. 3 according to an exemplary disclosed embodiment.
Figure 6:
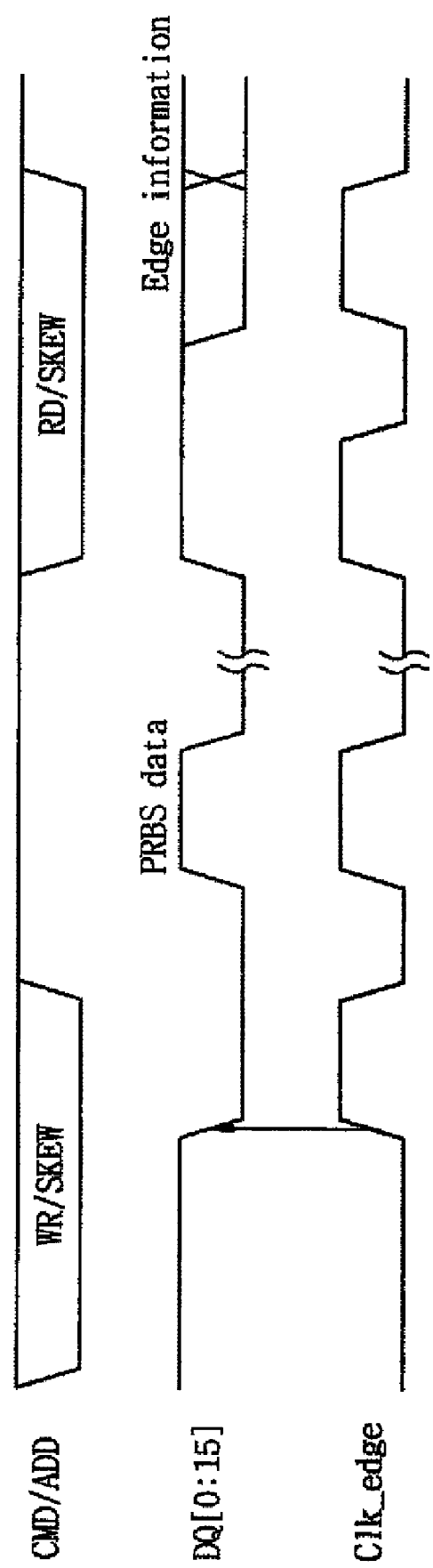
FIG. 6 is a timing diagram illustrating periodic skew calibration operation of the skew eliminating circuit of FIG. 3 according to an exemplary disclosed embodiment.

FIGS. 5 and 6 are operation timing diagrams of the scheme of FIG. 3. Specifically, FIG. 5 is a timing diagram in normal operation, and FIG. 6 is a timing diagram in periodic skew calibration operation.

Referring to FIGS. 3, 4 and 5, in the normal operation, the data receiving unit 114 identifies the data using clock data (Clk_data) of the DLL clock. Referring to FIG. 6, in the CBR operation or separate skew elimination operation, the memory controller 120 sends the pseudo data to the data input/output pin DQ[0:15] using a skew eliminating command CMD. The semiconductor memory device 100 samples the data using the clock edge (Clk_edge) of the DLL clock. In this case, because the clock edge (Clk_edge) is spaced from the clock data (Clk_data) at a half cycle, the data edge is sampled. Beneficially, the pseudo data pattern has such a length that the pseudo data pattern reflects all patterns. Furthermore, when the skew write (WR/SKEW) period of the semiconductor memory device 100 ends, the memory controller 120 fetches the data in the read operation.

Figure 7:
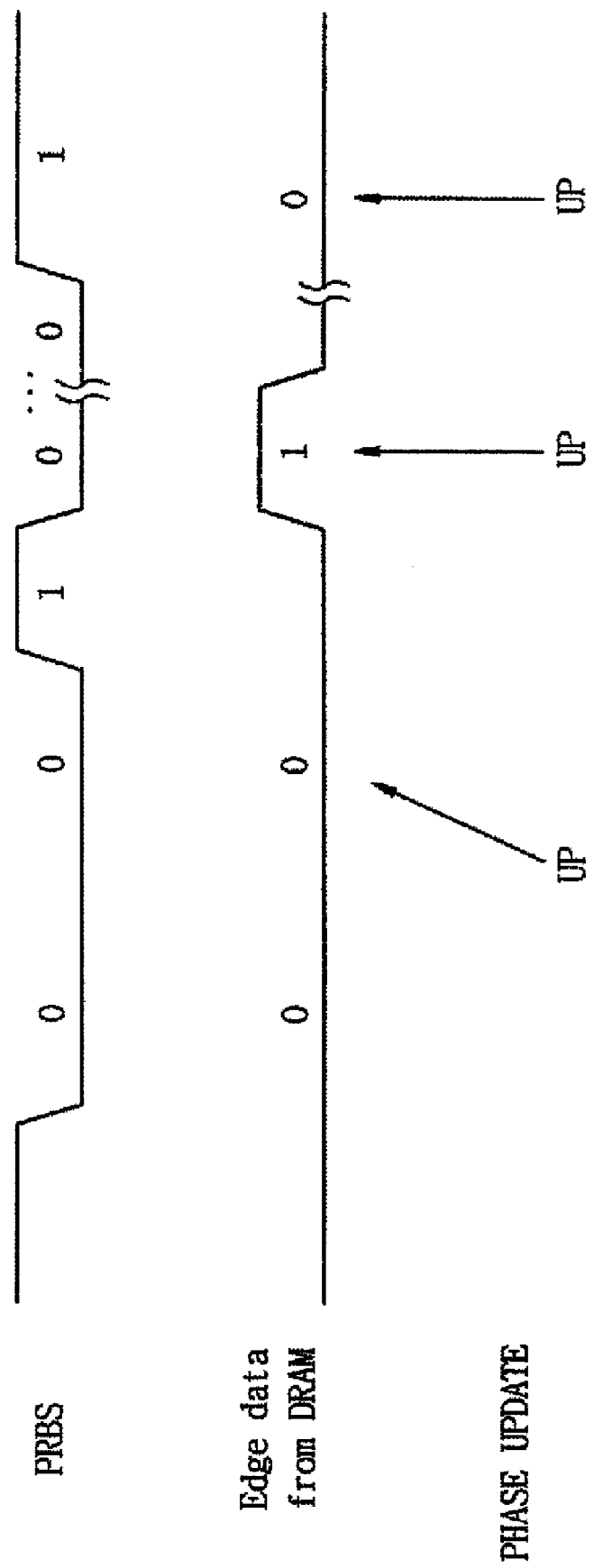
FIG. 7 is a timing diagram illustrating CDR operation of the memory controller in CDR operation of the skew eliminating circuit of FIG. 3 according to an exemplary disclosed embodiment.

FIG. 7 is a timing diagram illustrating CDR operation of the memory controller in a CDR operation of the skew eliminating circuit of FIG. 3. Referring to FIGS. 3, 4 and 7, a CDR operation of the memory controller fetching the edge information is shown. Knowing the pseudo data pattern information, the controller can perform majority voting using the edge information. This operation is basically the same as the existing CDR operation.

Figure 8A:
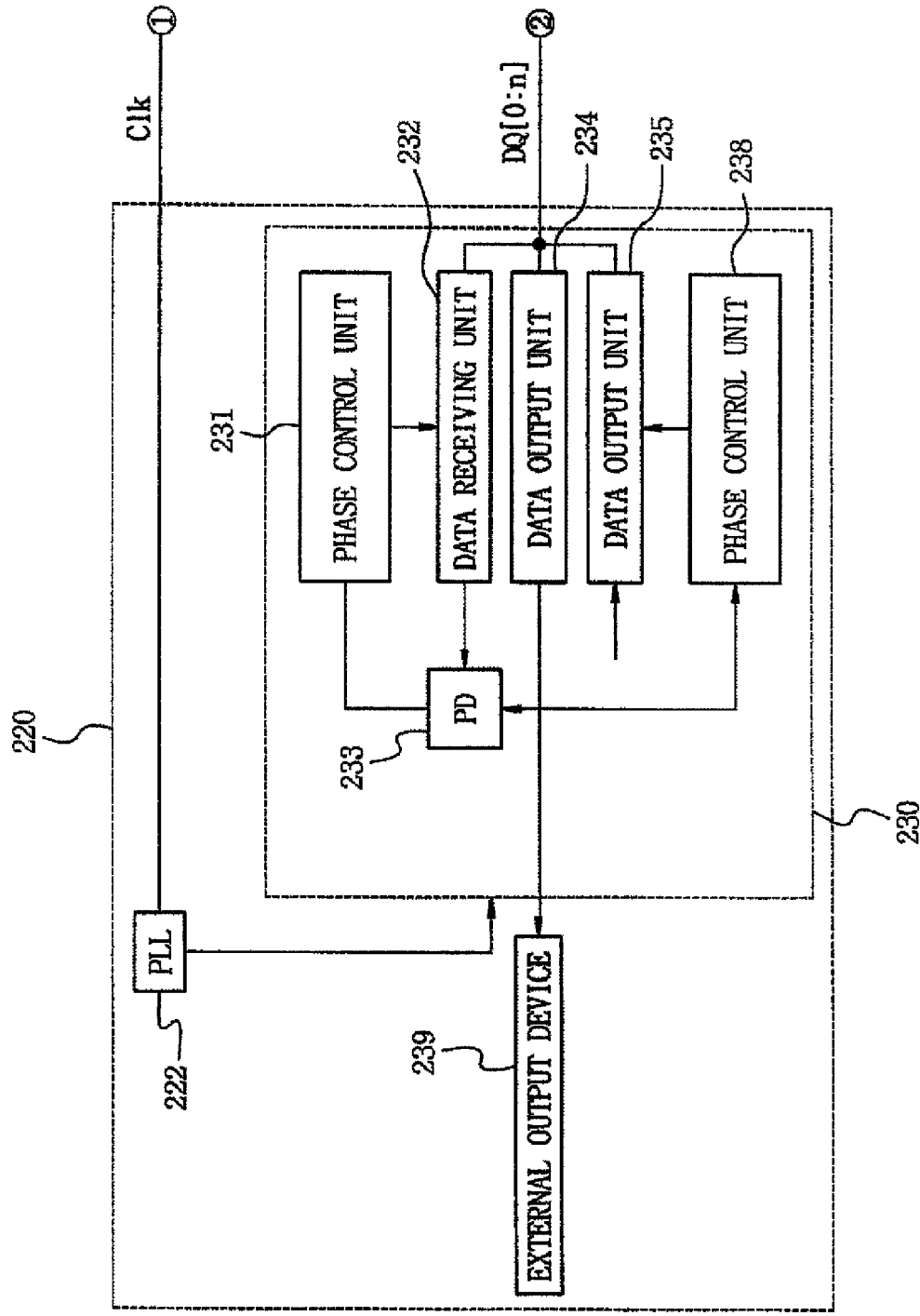
FIG. 8 is a block diagram illustrating a method for eliminating a skew according to an alternative exemplary disclosed embodiment.
Figure 8B:
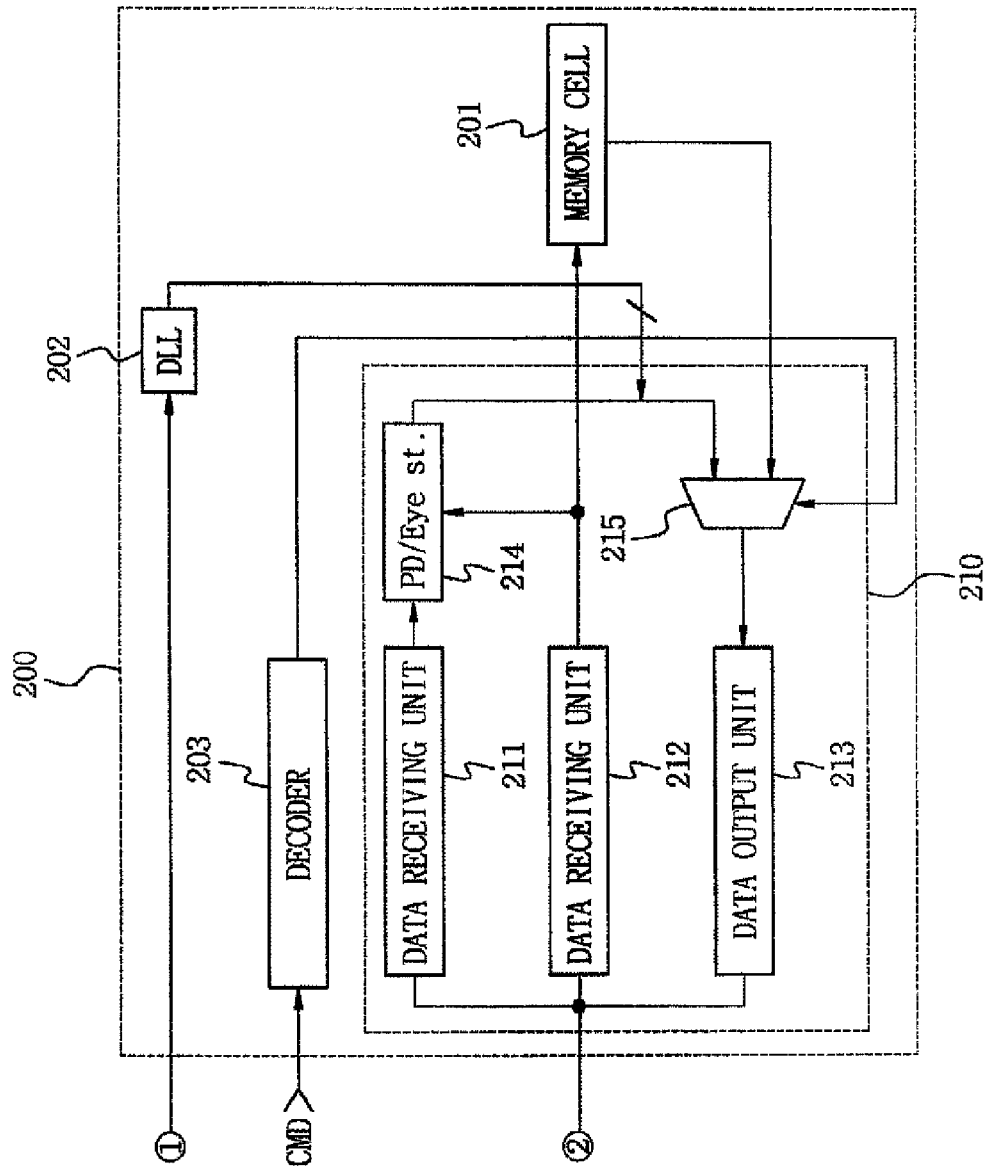

FIG. 8 is a block diagram illustrating a method for eliminating a skew according to an alternative exemplary disclosed embodiment. Referring to FIG. 8, CDR phase detection in the data write operation is performed entirely in a semiconductor memory device 200. As shown in FIG. 8B, in the semiconductor memory device 200, a receiving unit 211 performs data oversampling and a phase information calculating unit (PD/Eye St.) 214 performs the corresponding calculation.

In a CBR mode or when a separate skew eliminating command is input, the semiconductor memory device 200 sends phase information of a data input/output pin DQ[0:n] to a memory controller 220 via the data input/output pin. The memory controller 220 receives this information to adjust the phase of the data of the data output unit 235. Specifically, a phase control unit 238 in the memory controller 220 adjusts the phase of the data.

In the semiconductor memory device 200, the oversampling operation may be continuously performed in data write operation, or may be performed only in the skew elimination operation using PRBS data to reduce power consumption. In an exemplary embodiment, the number of circuits in the semiconductor memory device 200 increases, but the phase information can be easily obtained by the memory controller 220 in comparison with the previous embodiment, thereby shortening a skew elimination time.

A method for eliminating a skew according to an exemplary disclosed embodiment will now be described. The method for eliminating a skew between data and a clock signal in the interface between the semiconductor memory device and the memory controller according to an exemplary disclosed embodiment includes (1) reading data edge information from the semiconductor memory device, (2) detecting a phase difference between the data and the clock signal using the read data edge information and preset data information, and (3) adjusting the phase of the clock signal according to the detected phase difference.

In the disclosed skew elimination method, the CDR operation is performed in each data period, such that the per-data input/output pin skew is eliminated in the data write and read operation of the semiconductor memory device. Furthermore, in the data read operation of the semiconductor memory device, the skew can be eliminated by performing the clock data recovery operation to extract the sampling clock from the data. The method may further comprise the step of eliminating the dynamic skew caused by variation in operation temperature and voltage. As previously described in terms of the skew eliminating circuit, the dynamic skew eliminating step is beneficially performed in the refresh section for the semiconductor memory device. Because the processes of reading data edge information, detecting a phase difference, and adjusting the phase of the clock signal have been described in terms of the skew eliminating circuit with reference to FIGS. 3 to 7, an overlapping description will be omitted.

As described above, the disclosed circuit which eliminates a skew and the method for eliminating a skew by using the same, may make it possible to solve problems with a conventional CDR scheme for reducing a skew between data and a clock signal. For example, a receiving circuit for identifying a clock edge, data, and a sampling clock and detecting an edge of the data, and a phase control circuit for changing the phase of the clock are not separately required.

The disclosed circuits and method may also be used to solve problems with a conventional per-pin skew calibration scheme for reducing a skew between data and a clock signal. For example, the skew calibration time can be shortened by using the disclosed circuits and method.

The disclosure has been described using exemplary embodiments. However, it is to be understood that the scope of the disclosure is not limited to the disclosed embodiments. On the contrary, the scope of the disclosure is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A circuit for eliminating a skew between data and a clock signal in an interface between a semiconductor memory device and a memory controller, the circuit comprising:
    an edge information storage unit which stores edge information output from the semiconductor memory device;
    a pseudo data pattern generating unit which outputs pseudo data including a pattern corresponding to actually transmitted data;
    a phase detecting unit which receives the edge information from the edge information storage unit and the pseudo data from the pseudo data pattern generating unit to detect a phase difference between the data and the clock signal and generate a corresponding detection result; and
    a phase control unit which controls a phase of the clock signal according to the corresponding detection result from the phase detecting unit, so as to eliminate a per-data input/output pin skew in a data write and read operation of the semiconductor memory device.

2. The circuit according to claim 1, wherein the circuit performs a clock data recovery (CDR) operation which extracts a sampling clock from the data in the data read operation of the semiconductor memory device so as to eliminate the skew.

3. The circuit according to claim 2, wherein the circuit performs a per-data input/output pin skew elimination operation in each refresh section of the semiconductor memory device to reduce a dynamic skew.

4. The circuit according to claim 3, wherein the dynamic skew is caused by a variation in operation temperature and voltage.

5. The circuit according to claim 4, wherein the refresh section is a CAS (Column Address Strobe) before RAS (Row address strobe) (CBR) section of the semiconductor memory device.

6. A method for eliminating a skew between data and a clock signal in an interface between a semiconductor memory device and a memory controller, the method comprising:
    reading data edge information from the semiconductor memory device;
    generating a pseudo data pattern corresponding to actually transmitted data;
    detecting a phase difference between the data and the clock signal using the read data edge information and the pseudo data pattern; and
    adjusting a phase of the clock signal according to the detected phase difference, wherein clock data recovery operation is performed in each data period to eliminate a per-data input/output pin skew in a data write and read operation of the semiconductor memory device.

7. The method according to claim 6, further comprising eliminating a dynamic skew caused by variation in operation temperature and voltage.

8. The method according to claim 7, wherein the dynamic skew is eliminated in a refresh section of the semiconductor memory device.

9. A method for eliminating a skew between data and a clock signal in an interface between a semiconductor memory device and a memory controller, the method comprising:
    reading data edge information from the semiconductor memory device;
    detecting a phase difference between the data and the clock signal using the read data edge information and preset data information; and
    adjusting a phase of the clock signal according to the detected phase difference, wherein clock data recovery operation is performed in each data period to eliminate a per-data input/output pin skew in a data write and read operation of the semiconductor memory device,
    wherein in the data read operation of the semiconductor memory device, clock data recovery operation for extracting a sampling clock from the data is performed so as to eliminate the skew.

* * * * *